United States Patent
deVilliers et al.

(10) Patent No.: US 10,522,428 B2
(45) Date of Patent: Dec. 31, 2019

(54) CRITICAL DIMENSION CONTROL BY USE OF A PHOTO AGENT

(71) Applicant: Tokyo Electron Limited, Tokyo (JP)

(72) Inventors: Anton J. deVilliers, Clifton Park, NY (US); Michael A. Carcasi, Austin, TX (US)

(73) Assignee: Tokyo Electron Limited, Tokyo (JP)

(*) Notice: Subject to any disclaimer, the term of this patent is extended or adjusted under 35 U.S.C. 154(b) by 0 days.

(21) Appl. No.: 16/154,018

(22) Filed: Oct. 8, 2018

(65) Prior Publication Data

US 2019/0043765 A1    Feb. 7, 2019

Related U.S. Application Data

(63) Continuation of application No. 15/594,187, filed on May 12, 2017, now Pat. No. 10,096,528.
(Continued)

(51) Int. Cl.
*H01L 21/66* (2006.01)
*H01L 21/027* (2006.01)
(Continued)

(52) U.S. Cl.
CPC .......... *H01L 22/20* (2013.01); *G03F 7/0035* (2013.01); *G03F 7/2051* (2013.01);
(Continued)

(58) Field of Classification Search
None
See application file for complete search history.

(56) References Cited

U.S. PATENT DOCUMENTS 4,402,571 A    9/1983    Cowan et al.
4,609,615 A    9/1986    Yamashita et al.
(Continued)

FOREIGN PATENT DOCUMENTS

CN    101738872 B    4/2013
EP    583205 A1    2/1994
(Continued)

OTHER PUBLICATIONS

PCT Office, International Preliminary Report on Patentability issued in PCT/US2017/032435 dated Nov. 22, 2018, 8 pages.
(Continued)

*Primary Examiner* — Bo B Jang
(74) *Attorney, Agent, or Firm* — Wood Herron & Evans LLP

(57) ABSTRACT

A method for critical dimension control in which a substrate is received having an underlying layer and a patterned layer formed on the underlying layer, the patterned layer including radiation-sensitive material and a pattern of varying elevation with a first critical dimension. The method further includes applying an overcoat layer over the patterned layer, the overcoat layer containing a photo agent selected from a photosensitizer generator compound, a photosensitizer compound, a photoacid generator compound, a photoactive agent, an acid-containing compound, or a combination of two or more thereof. The overcoat layer is then exposed to electromagnetic radiation, wherein the dose of electromagnetic radiation incident upon different exposed regions of the substrate is varied, and then the overcoat layer and patterned layer are heated. The method further includes developing the overcoat layer and the patterned layer to alter the first critical dimension of the patterned layer to a second critical dimension.

21 Claims, 2 Drawing Sheets

Related U.S. Application Data

(60) Provisional application No. 62/335,991, filed on May 13, 2016.

(51) Int. Cl.
*H01L 21/311* (2006.01)
*G03F 7/00* (2006.01)
*G03F 7/20* (2006.01)
*G03F 7/40* (2006.01)

(52) U.S. Cl.
CPC ............ *G03F 7/2053* (2013.01); *G03F 7/405* (2013.01); *G03F 7/70466* (2013.01); *G03F 7/70558* (2013.01); *H01L 21/0274* (2013.01); *H01L 21/31144* (2013.01)

(56) References Cited

U.S. PATENT DOCUMENTS

| | | | |
|---|---|---|---|
| 4,751,169 | A | 6/1988 | Behringer et al. |
| 4,804,612 | A | 2/1989 | Asaumi et al. |
| 4,931,380 | A | 6/1990 | Owens et al. |
| 4,933,263 | A | 6/1990 | Okuda et al. |
| 5,370,973 | A | 12/1994 | Nishii |
| 5,534,970 | A | 7/1996 | Nakashima et al. |
| 5,707,784 | A | 1/1998 | Oikawa et al. |
| 5,820,679 | A | 10/1998 | Yokoyama et al. |
| 5,905,019 | A | 5/1999 | Obszarny |
| 6,180,320 | B1 | 1/2001 | Saito et al. |
| 6,242,160 | B1 | 6/2001 | Fukuzawa et al. |
| 6,245,492 | B1 | 6/2001 | Huang et al. |
| 6,296,985 | B1 | 10/2001 | Mizutani et al. |
| 6,331,383 | B1 | 12/2001 | Sakai |
| 6,440,632 | B2 | 8/2002 | Yasuda |
| 6,555,479 | B1 | 4/2003 | Hause et al. |
| 6,844,135 | B2 | 1/2005 | Kon et al. |
| 6,900,001 | B2 | 5/2005 | Livesay et al. |
| 6,968,253 | B2 | 11/2005 | Mack et al. |
| 7,142,941 | B2 | 11/2006 | Mack et al. |
| 7,327,436 | B2 | 2/2008 | Fukuhara et al. |
| 7,488,933 | B2 | 2/2009 | Ye et al. |
| 7,829,269 | B1 | 11/2010 | Fonseca et al. |
| 7,858,289 | B2 | 12/2010 | Yamashita |
| 7,966,582 | B2 | 6/2011 | Melvin, III et al. |
| 8,088,548 | B2 | 1/2012 | Houlihan et al. |
| 8,428,762 | B2 | 4/2013 | Graves et al. |
| 8,443,308 | B2 | 5/2013 | Shiely et al. |
| 8,589,827 | B2 | 11/2013 | Biafore et al. |
| 9,009,647 | B2 | 4/2015 | Ye et al. |
| 9,519,227 | B2 | 12/2016 | Carcasi et al. |
| 9,618,848 | B2 | 4/2017 | Carcasi et al. |
| 9,645,495 | B2 | 5/2017 | deVilliers |
| 9,746,774 | B2 | 8/2017 | Carcasi et al. |
| 2002/0030800 | A1 | 3/2002 | Nellissen |
| 2002/0102490 | A1 | 8/2002 | Ito et al. |
| 2003/0049571 | A1 | 3/2003 | Hallock et al. |
| 2003/0163295 | A1 | 8/2003 | Jakatdar et al. |
| 2004/0152024 | A1 | 8/2004 | Livesay et al. |
| 2005/0008864 | A1 | 1/2005 | Ingen Schenau et al. |
| 2005/0214674 | A1 | 9/2005 | Sui et al. |
| 2006/0040208 | A1 | 2/2006 | Tarutani et al. |
| 2006/0269879 | A1 | 11/2006 | Elian et al. |
| 2007/0032896 | A1 | 2/2007 | Ye et al. |
| 2007/0184648 | A1 | 8/2007 | Yoon et al. |
| 2007/0275330 | A1 | 11/2007 | Bailey et al. |
| 2007/0292770 | A1 | 12/2007 | Strauss |
| 2008/0038675 | A1 | 2/2008 | Nagasaka |
| 2008/0230722 | A1 | 9/2008 | Elian |
| 2009/0162796 | A1 | 6/2009 | Yun et al. |
| 2009/0214985 | A1 | 8/2009 | Kulp |
| 2009/0274974 | A1 | 11/2009 | Abdallah et al. |
| 2010/0119972 | A1 | 5/2010 | Houlihan et al. |
| 2010/0213580 | A1 | 8/2010 | Meador et al. |
| 2010/0245790 | A1 | 9/2010 | Seltmann et al. |
| 2010/0273099 | A1 | 10/2010 | Fonseca et al. |
| 2010/0291490 | A1 | 11/2010 | Tsuruda et al. |
| 2011/0043791 | A1 | 2/2011 | Smilde et al. |
| 2011/0147984 | A1 | 6/2011 | Cheng et al. |
| 2011/0171569 | A1 | 7/2011 | Nishimae et al. |
| 2011/0177464 | A1 | 7/2011 | Takeda et al. |
| 2011/0205505 | A1 | 8/2011 | Somervell et al. |
| 2011/0250540 | A1 | 10/2011 | Huang et al. |
| 2013/0084532 | A1 | 4/2013 | Wu et al. |
| 2013/0164691 | A1 | 6/2013 | Shiobara |
| 2013/0171571 | A1 | 7/2013 | Dunn et al. |
| 2013/0204594 | A1 | 8/2013 | Liu |
| 2013/0232457 | A1 | 9/2013 | Ye et al. |
| 2013/0234294 | A1 | 9/2013 | Hu et al. |
| 2013/0260313 | A1 | 10/2013 | Allen et al. |
| 2014/0227538 | A1 | 8/2014 | Baldwin et al. |
| 2015/0214056 | A1 | 7/2015 | Xu et al. |
| 2015/0241781 | A1 | 8/2015 | Carcasi et al. |
| 2015/0241782 | A1 | 8/2015 | Scheer et al. |
| 2015/0241783 | A1 | 8/2015 | Carcasi et al. |
| 2015/0241793 | A1 | 8/2015 | Carcasi et al. |
| 2016/0004160 | A1 | 1/2016 | Tagawa et al. |
| 2016/0048080 | A1 | 2/2016 | deVilliers |
| 2016/0357103 | A1 | 12/2016 | Nagahara et al. |
| 2017/0052448 | A1 | 2/2017 | Nakagawa et al. |
| 2017/0052449 | A1 | 2/2017 | Nakagawa et al. |
| 2017/0052450 | A1 | 2/2017 | Nakagawa et al. |
| 2017/0192357 | A1 | 7/2017 | Carcasi et al. |
| 2017/0242342 | A1 | 8/2017 | Carcasi et al. |
| 2017/0242344 | A1 | 8/2017 | Carcasi et al. |
| 2017/0329229 | A1 | 11/2017 | Carcasi et al. |
| 2017/0330806 | A1 | 11/2017 | deVilliers et al. |

FOREIGN PATENT DOCUMENTS

| | | | |
|---|---|---|---|
| EP | 2048700 | A2 | 4/2009 |
| JP | 04-239116 | A | 8/1992 |
| JP | 09-211871 | A | 8/1997 |
| JP | 2000-208408 | A | 7/2000 |
| JP | 2002006512 | A | 1/2002 |
| JP | 2007501431 | A | 1/2007 |
| JP | 2007334036 | A | 12/2007 |
| JP | 2013140319 | A | 7/2013 |
| JP | 2013228447 | A | 11/2013 |
| JP | 201429435 | A | 2/2014 |
| JP | 2015172741 | A | 10/2015 |
| KR | 20120058572 | A | 6/2012 |
| TW | I273457 | B | 2/2007 |
| TW | 201539539 | A | 10/2015 |
| TW | 201541194 | A | 11/2015 |
| WO | 2003001297 | A2 | 1/2003 |
| WO | 2005013007 | A1 | 2/2005 |
| WO | 2013007442 | A1 | 1/2013 |

OTHER PUBLICATIONS

PCT Office, International Preliminary Report on Patentability issued in PCT/US17/032450 dated Nov. 22, 2018, 8 pages.
U.S. Patent and Trademark Office, Office Action issued in corresponding U.S. Appl. No. 15/445,738 dated Sep. 14, 2018, 25 pages.
U.S. Patent and Trademark Office, Advisory Action issued in corresponding U.S. Appl. No. 15/445,738 dated Jan. 3, 2019, 8 pages.
U.S. Patent and Trademark Office, Office Action in corresponding U.S. Appl. No. 15/594,139 dated Jan. 10, 2019.
S. Tagawa, et al., "Super High Sensitivity Enhancement by Photo-Sensitized Chemically Amplified Resist Process", Journal of Photopolymer Science and Technology, vol. 26, No. 6 (2013), pp. 825-830.
S. Tagawa, et al., "New Sensitization Method of Chemically Amplified EUV/EB Resists," presented at the 2013 International Symposium on EUV Lithography, Toyama, Japan Oct. 6-10, 2013.
A Ravve, "Light-Associated Reactions of Synthetic Polymers", Springer Science-Business Media, ISBN 0387318038, pp. 23-25, 2006.
International Searching Authority, Search Report and Written Opinion issued in related International Application PCT/US2015/017056, dated May 29, 2015, 10 pp.

(56) References Cited

OTHER PUBLICATIONS

International Searching Authority, Search Report and Written Opinion issued in related International Application PCT/US2015/017071 dated May 29, 2015, 13 pp.
International Bureau of WIPO, International Preliminary Report on Patentability issued in related International Application No. PCT/US2015/017056 dated Aug. 30, 2016, 7 pp.
International Bureau of WIPO, International Preliminary Report on Patentability issued in related International Application No. PCT/US2015/017071 dated Aug. 30, 2016, 10 pp.
International Bureau of WIPO, International Preliminary Report on Patentability issued in corresponding International Application No. PCT/US2015/017056 dated Aug. 30, 2016, 7 pp.
Lowes et al. "Comparative Study of Photosensitive versus Non-Photosensitive Developer-Soluble Bottom Anti-Reflective Coating Systems", ECS Transactions 27(1) pp. 503-508 (2010).
"Understanding Brewer Science ARC Products," Brewer Science (23 pages (2002)).
Nagahara et al., Challenge Toward Breakage of RLS Trade-off for EUV Lithography by Photosensitized Chemically Amplified Resist (PSCAR) with Flood Exposure, SPIE International Society for Optical Engineering Proceedings, vol. 9776, Mar. 18, 2016, 18 pp.
International Searching Authority, Search Report and Written Opinion issued in related International Application PCT/US2017/032435, dated Aug. 14, 2017, 14 pp.
International Searching Authority, Search Report and Written Opinion issued in related International Application PCT/US2017/032450, dated Aug. 10, 2017, 12 pp.
International Searching Authority, Search Report and Written Opinion issued in related International Application PCT/US2017/018332 dated Jun. 1, 2017, 12 pp.
International Searching Authority, Search Report and Written Opinion issued in related International Application PCT/US2017/018337 dated Jun. 5, 2017, 12 pp.
Taiwan Intellectual Property Office, Notice of Allowance issued in corresponding Taiwanese Patent Application No. 106115728 dated Feb. 15, 2019.
U.S. Patent and Trademark Office, Office Action issued in corresponding U.S. Appl. No. 15/048,584 dated Feb. 15, 2019.
Wang, C.W. et al., "Photobase generator and photo decomposable quencher for high-resolution photoresist applications," Proc. SPIE 7639, Advances in Resist Materials and Processing Technology XXVII, 76390W (Mar. 29, 2010).
U.S. Patent and Trademark Office, Office Action in corresponding U.S. Appl. No. 15/445,738 dated Apr. 15, 2019.
Wolf, Stanley and Tauber, Richard, Silicon Processing for the VLSI Era, vol. 1, Process Technology, Lattice Press, Sunset Beach, California, pp. 407-409 and 441-446, 1986.
U.S. Patent and Trademark Office, Office Action in corresponding U.S. Appl. No. 15/594,139 dated Aug. 9, 2019.
Semiconductor Onesource: Semiconductor Glossary—Search for: critical dimension, cd copyright 2016, one page (Year: 2016).
Kang et al., Microelectronics Reliability 46 (2006) 1006-1012. (Year: 2006).
Definition of critical dimension—cd—Chemistry Dictionary Definition of critical dimension (CD) copyright 2017 one page from chemicool.com. (Year 2017).
Japanese Patent Office, Office Action in corresponding Japanese Patent Application No. 2016-570931 dated Aug. 20, 2019.

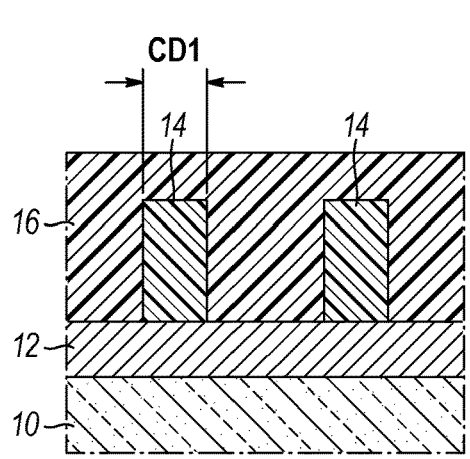

FIG. 1A

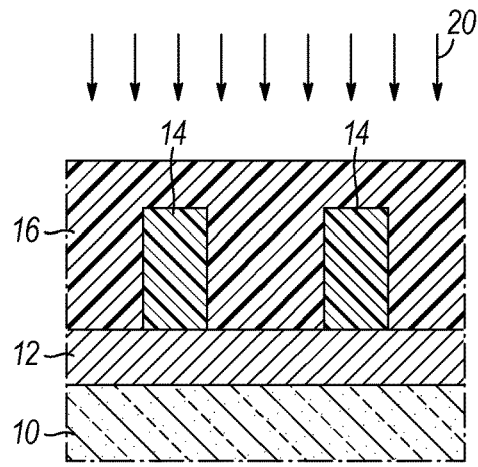

FIG. 1B

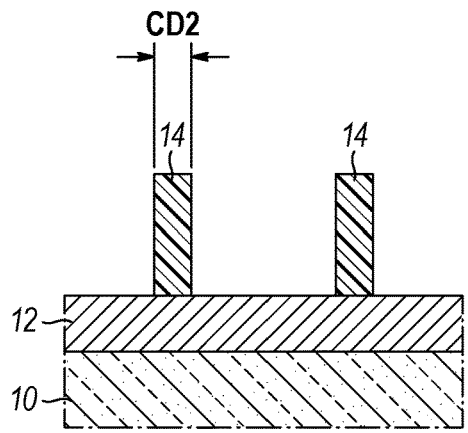

FIG. 1C

| ROTATION (RPM) | SCAN RATE (mm/s) | POWER (W/cm²) | LIGHT WORKING DISTANCE (mm) | APERTURE (if used) | FOCUS POSITION |
|---|---|---|---|---|---|
| CONSTANT | CONSTANT | CONSTANT | CONSTANT | CONSTANT | CONSTANT |
| CONSTANT | CONSTANT | VARIABLE | CONSTANT | CONSTANT | CONSTANT |
| CONSTANT | VARIABLE | CONSTANT | CONSTANT | CONSTANT | CONSTANT |
| CONSTANT | VARIABLE | VARIABLE | CONSTANT | CONSTANT | CONSTANT |
| CONSTANT | CONSTANT | CONSTANT | CONSTANT | VARIABLE | CONSTANT |
| CONSTANT | CONSTANT | CONSTANT | VARIABLE | CONSTANT | CONSTANT |
| CONSTANT | CONSTANT | CONSTANT | CONSTANT | CONSTANT | VARIABLE |

FIG. 2

CRITICAL DIMENSION CONTROL BY USE OF A PHOTO AGENT

CROSS REFERENCE TO RELATED APPLICATIONS

This application is a continuation of U.S. Pat. No. 10,096,528 issued Oct. 9, 2018 and entitled CRITICAL DIMENSION CONTROL BY USE OF A PHOTO AGENT which claims benefit of and priority to U.S. Provisional Patent Application No. 62/335,991, filed on May 13, 2016, entitled CRITICAL DIMENSION CONTROL BY USE OF A PHOTO-ACTIVE AGENT, which are incorporated herein by reference in their entirety as if completely set forth herein below.

BACKGROUND OF THE INVENTION

Field of the Invention

This invention relates to location-specific critical dimension (CD) alteration/correction flows and processes for improvement of CD uniformity.

Description of Related Art

Techniques disclosed herein relate to microfabrication and, in particular, relate to photolithography and patterning processes. In material processing methodologies (such as photolithography), creating patterned layers typically involves the application of a thin layer of radiation-sensitive material, such as photoresist, to a surface of a substrate. This radiation-sensitive material is transformed into a patterned mask that can be used to etch or transfer a pattern into an underlying layer on a substrate. Patterning of the radiation-sensitive material generally involves exposure by a radiation source through a reticle (and associated optics) onto the radiation-sensitive material using, for example, a photolithography system. This exposure creates a latent image or pattern within the radiation sensitive material which can then be developed. Particular wavelengths of light cause exposed portions of the radiation-sensitive material to change its solubility by either becoming soluble or insoluble to a particular solvent. Developing refers to dissolving and removing a portion of the radiation-sensitive material to yield a topographic or physical pattern, that is, a relief pattern. For example, developing can include removal of irradiated regions of the radiation-sensitive material (as in the case of positive photoresist), or non-irradiated regions (as in the case of negative resist) using a developing solvent. The relief pattern can then function as a mask layer for subsequent processing.

As industry shrinks continue to push minimum feature sizes to smaller and smaller CDs and with the delay and potential high cost of EUV (13.5 nm), the industry has looked for processes that further extend their current ArF (193 nm) immersion (ArFi) scanner systems, including both infrastructure and expertise. CD alteration, such as shrinking/slimming, of the traditional post photolithography ArFi near resolution-limited resist features is one such extension. The ability to improve across-wafer critical dimension uniformity (CDU) around a current CD target, and/or to alter the CD of holes, trenches and/or lines in a controlled process has current and future applications in single patterning, such as in logic design where gate layers have very small features on a slightly less aggressive pitch, and in double patterning/multi-patterning schemes, such as in Litho-Etch-Litho-Etch (LELE) or Litho-Etch repeated "n" times (LE$^n$), Litho-Litho-Etch (LLE), and precursors for sidewall spacers.

The CD alteration process has historically been achieved by 3 methods. The first CD alteration method uses a post-photolithography etch-based plasma trim process for lines (or tapered etch process of holes or trenches), where the process flow includes Coat→Expose→Post Exposure Bake (PEB)→Develop (nominal temperature)→Etch Trim/Shrink. More recently, a second CD alteration method, which is a wet-process, has been proposed in which additional processing steps are performed in the litho-cell, such as a positive tone hot develop (>30° C.) process or an acid rinse/acid rinse bake process, or a combination of the two. The hot develop process shifts the de-protection level at which development stops to a lower level of de-protection. The positive tone hot develop process flow includes Coat→Expose→PEB→Positive Tone Develop (nominal temperature)→Positive Tone Hot Develop (>30° C.). The acid rinse/acid rinse bake process shifts the de-protection level within the matrix of the first developed feature to a higher level, allowing for a second develop process to alter the CD of the feature using standard or modified develop solution. The acid rinse/acid rinse bake process flow includes Coat→Expose→PEB→Positive Tone Develop (nominal temperature)→Acid Rinse→Acid Rinse Bake→Positive Tone Develop (nominal temperature). The combination process flow includes Coat→Expose→PEB→Positive Tone Develop (nominal temperature)→Positive Tone Hot Develop (>30° C.)→Acid Rinse→Acid Rinse Bake→Positive Tone Develop (nominal temperature). Even more recently, a third CD alteration method, which is also a wet-process, has been proposed in which additional processing steps, such as a non-location-specific flood exposure and bake prior to a second development, are utilized to bring the film to a fully or nearly fully de-protected state, at which point development is controlled by development time. The process flow includes Coat→Expose→PEB→Positive Tone Develop (nominal temperature)→Flood Expose→Flood Bake→2nd Develop.

The wet-process examples above are a subset of the various ways in which wet-process CD alteration has been proposed historically.

The first CD alteration method, which is an etch-based plasma method, has the benefit of less potential for pattern collapse due to the lack of any surface tension effects (that are present in wet processing), which means no capillary forces, but has shown the following possible issues that become more problematic at very small CD targets and continued shrinking: the potential to negatively impact or damage organic bottom anti-reflective coatings (BARCs); some secondary effects such as polymer densification that begin to negatively impact structural integrity performance at very small dimensions; pattern density effects, i.e., iso-dense bias; chamber etch uniformity concerns (center-to-edge); process stability/maintainability (due to re-deposition on chamber walls); and/or potential high additional front-end capital cost.

The recently proposed second CD alteration method, which is a wet process, while avoiding etch-specific issues, has the problem of having the magnitude and control of CD change highly correlated to aerial image log-slope (ILS) and resulting de-protection matrix/gradient in the case of the positive tone hot develop process flow.

The other process flows of the second CD alteration method (e.g., the acid rinse/acid rinse bake or the combination process flow), which include the acid rinse and bake steps, similarly come with some new concerns. It is ultimately a diffusion-based process, meaning local amount of CD alteration is correlated to local concentration levels and reaction kinetics as well as time and temperature. Via simulation, it has been observed that this can lead to a potential undercutting due to local changes in the de-protection matrix through defocus and possibly a pattern breaking failure mechanism due to non-homogeneity of resist components leading to stochastic weak points in the line.

The third CD alteration method, which is also a wet process, where the process flow includes the blanket flood exposure and flood bake, similarly comes with some new concerns. Because it attempts to take the film to a fully de-protected state (for homogeneity benefits), it requires modified develop solution conditions to ensure process control via develop time.

Historically, wet CD alteration-based concepts revolved around methods in which the time and/or concentration of a wet chemistry development was linked with the amount and control of CD alteration. Furthermore, to maintain profile control while maximizing the CD alteration amount achievable under these additional development processing steps (CD alteration amount previously limited by level of de-protection remaining within the resist matrix from the patterning exposure), the resist matrix was attempted to be taken to a more homogenized state by introducing methods to increase the de-protection level, if not fully de-protect the resist matrix, e.g., by blanket flood, thermal acid generators (TAGs), and acid rinses.

The condition of a fully de-protected resist matrix prior to the slimming/shrinking develop step (i.e., at the 2nd develop) generally meant that top-loss would be equivalent to side loss. Furthermore, it meant that the develop chemistry had to be altered, for example, using a negative tone develop (NTD) process and developing at the develop rate minimum ($R_{min}$), using a dilute aqueous base developer in a positive tone develop (PTD) process and developing at a modified develop rate maximum ($R_{max}$), using an inhibited aqueous base developer in a PTD process and developing at an inhibited $R_{max}$, and/or using a cold aqueous base developer in a PTD process and developing at a modified $R_{max}$, to make the CD alteration rate reasonable (e.g., 0.1 to a few nm/s) without completely washing away a feature in the first few milliseconds of the 2nd develop. Similarly, the de-protection matrix pre-slimming develop condition (2nd develop) left by acid rinse diffusion and bake generally meant that top-loss would be equivalent to side loss.

There is thus a need for a method to maximize the amount of CD alteration achievable while allowing for more standard development conditions.

SUMMARY OF THE INVENTION

This disclosure offers an alternative way to maximize the amount of CD alteration and an alternative flow for control/correction. In an embodiment, the method comprises receiving a substrate having an underlying layer and a patterned layer formed on the underlying layer, the patterned layer comprising radiation-sensitive material and further comprising a pattern of varying elevation and having a first critical dimension. The method further comprises applying an overcoat layer over the patterned layer, the overcoat layer comprising a photo agent selected from a photosensitizer generator compound, a photosensitizer compound, a photoacid generator compound, a photoactive agent, an acid-containing compound, or a combination of two or more thereof. The overcoat layer is then exposed to electromagnetic radiation, wherein the dose of electromagnetic radiation incident upon different exposed regions of the substrate is varied, and then the overcoat layer and patterned layer are heated. The method further comprises developing the overcoat layer and the patterned layer to alter the first critical dimension of the patterned layer to a second critical dimension.

In another embodiment, the method comprises receiving a substrate having an underlying layer and a radiation-sensitive material layer deposited on the underlying layer. The method further comprises exposing a first wavelength of light through a patterned mask onto the radiation-sensitive material layer and performing a post-exposure bake; first developing the pattern-exposed radiation-sensitive material layer to form a patterned layer of varying elevation and having a first critical dimension; obtaining first metrology data for the patterned layer following the first developing; and applying an overcoat layer over the patterned layer, the overcoat layer comprising a photo agent selected from a photosensitizer generator compound, a photosensitizer compound, a photoacid generator compound, a photoactive agent, an acid-containing compound, or a combination of two or more thereof. The overcoat layer is then exposed to electromagnetic radiation at a wavelength of 175 nm to 450 nm, wherein the dose of electromagnetic radiation incident upon different exposed regions of the substrate is varied and is based on the obtained first metrology data. The method further comprises performing a post-exposure bake of the overcoat layer and patterned layer; and developing the overcoat layer and the patterned layer to alter the first critical dimension of the patterned layer to a second critical dimension.

Of course, the order of discussion of the different steps as described herein has been presented for clarity sake. In general, these steps can be performed in any suitable order. Additionally, although each of the different features, techniques, configurations, etc. herein may be discussed in different places of this disclosure, it is intended that each of the concepts can be executed independently of each other or in combination with each other. Accordingly, the present invention can be embodied and viewed in many different ways.

Note that this summary section does not specify every embodiment and/or incrementally novel aspect of the present disclosure or claimed invention. Instead, this summary only provides a preliminary discussion of different embodiments and corresponding points of novelty over conventional techniques. For additional details and/or possible perspectives of the invention and embodiments, the reader is directed to the Detailed Description section and corresponding figures of the present disclosure as further discussed below.

BRIEF DESCRIPTION OF THE DRAWINGS

A more complete appreciation of the invention and many of the attendant advantages thereof will become readily apparent with reference to the following detailed description, particularly when considered in conjunction with the accompanying drawings, in which:

FIGS. 1A-1C are schematic cross-sectional views of a slimming method in accordance with an embodiment of the invention;

FIG. 2 is a table illustrating the various pathways to alter the radial dose signature delivered within-wafer to alter the final critical dimension.

DETAILED DESCRIPTION

Figure 3:
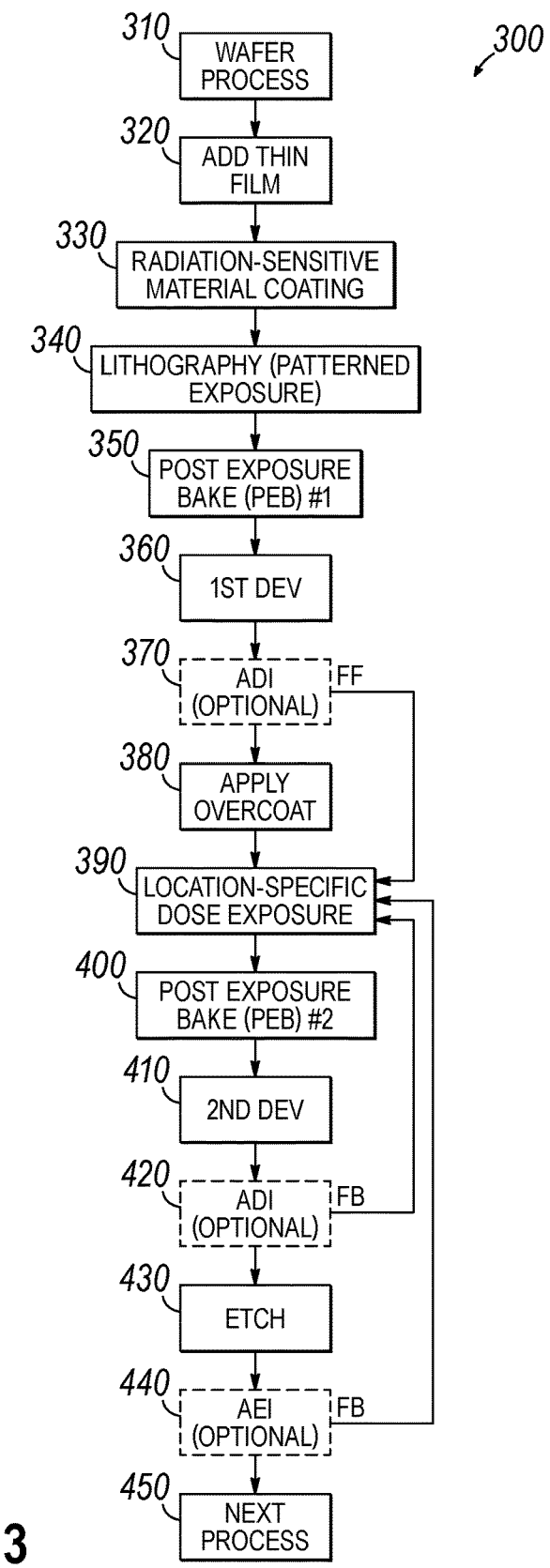
FIG. 3 is a flow chart depicting a process flow for critical dimension slimming according to an embodiment of the invention.

This disclosure offers an alternative method to maximize the amount of CD alteration achievable, breaking from the de-protection matrix being dictated by primary exposure conditions, and allowing for more standard development conditions. Furthermore, the method of this disclosure shifts CD alteration amount control to be largely controlled by flood dose rather than developer concentration and/or develop time, which simplifies the development process. Additionally, it introduces new photoactive chemistries to be used as the primary mechanism for acid generation that will ultimately lead to better de-protection control of the feature. Finally, it uses location-specific critical dimension (CD) alteration/correction flows and processes for improvement of CD uniformity, and in some embodiments shifting of CD targeting as well, making use, in some embodiments, of after develop inspection (ADI) information in a feed forward (FF) process control scheme by means of localized dose control of a flood process step.

With this modified approach to CD alteration, within-wafer (WIW) control schemes are also discussed.

The first embodiment of this invention proposes the use of an overcoat material that coats over a critical dimension feature layer defined by a traditional photolithography flow. With specific reference to the schematic cross-sectional views of FIGS. 1A-1C, a substrate 10 comprises an underlying layer 12 and a patterned layer 14 formed on the underlying layer 12. The patterned layer 14 comprises a radiation-sensitive material, for example a photoresist material, with a pattern of varying elevation and a first critical dimension, CD1. An overcoat layer 16 is applied over the patterned layer 14, as shown in FIG. 1A. The overcoat material contains at least one photo agent, such as a photosensitizer generator, a photosensitizer, a photoacid generator, a photoactive agent, and/or an acidic compound, or any combination of two or more thereof.

Photosensitizer molecules can absorb light energy and transfer the light energy to another molecule, such as a photoacid generator (PAG). This energy transfer can in turn activate the receiving molecule. In the case of a PAG receiving the energy transfer, the PAG can then generate acid. Some photosensitizer compounds may transfer energy in a ground state while others may conduct the transfer in an excited state. Exemplary photosensitizer compounds include, but are not limited to, acetophenone, triphenylene, benzophenone, fluorenone, anthraquinone, phenanthrene, or derivatives thereof.

A photoacid generator (PAG) can be a cationic photoinitiator that converts absorbed light energy into chemical energy (e.g., an acidic reaction). The photoacid generation compound may include, but is not limited to triphenylsulfonium triflate, triphenylsulfonium nonaflate, triphenylsulfonium perfluorooctylsulfonate, triarylsulfonium triflate, triarylsulfonium nonaflate, triarylsulfonium perfluorooctylsulfonate, a triphenylsulfonium salt, a triarylsulfonium salt, a triarylsulfonium hexafluoroantimonate salt, N-hydroxynaphthalimide triflate, 1,1-bis[p-chlorophenyl]-2,2,2-trichloroethane (DDT), 1,1-bis[p-methoxyphenyl]-2,2,2-trichloroethane, 1,2,5,6,9,10-hexabromocyclododecane, 1,10-dibromodecane, 1,1-bis[p-chlorophenyl]2,2-dichloroethane, 4,4-dichloro-2-(trichloromethyl)benzhydrol, 1,1-bis(chlorophenyl) 2-2,2-trichloroethanol, hexachlorodimethylsulfone, 2-chloro-6-(trichloromethyl)pyridine, or derivatives and/or combinations thereof.

The photoactive agent can include a second PAG, a thermal acid generator (TAG), or a photo-destructive base, also known as a photo-decomposable base. A photo-destructive base can include one or more base compounds that decompose in the exposed areas, which allows for a higher total base loading that can neutralize photoactive acids in the non-exposed areas. A photo-destructive base thus includes compounds that can provide this general base loading effect. The non-decomposed base will denature one or more photo acids such that these photo acids are no longer photosensitive, or no longer sensitive to radiation. As disclosed herein, by adding more base to a given resist film, a given acid concentration can be reduced. Likewise, a given acid concentration can be increased by selectively adding acid compounds.

Referring to FIG. 1B, the overcoat layer 16 is exposed to electromagnetic radiation 20. The overcoat material upon exposure of light, either directly or indirectly, produces acids, or changes acid concentration, within the overcoat material. This exposure process can be from any generic EM source, for example, a lamp, a laser, a bulb, etc. The EM source's exposure wavelength for generation of the acid within the overcoat material could be, but is not limited to, any wavelength, or range of wavelengths between 170~450 nm, which are wavelengths typical of photo agent material absorbance used by the industry in photolithography, with exemplary wavelengths being at/around 266 nm and/or at/around 365 nm. Depending on material properties, the wavelength and material choice for photo agents in the overcoat material could be chosen to escape the absorption of other components within the photoresist matrix of the critical feature (e.g., for this situation, an exemplary choice of 365 nm wavelength as a target for material absorption and exposure). In other embodiments, the ratio of absorbance of photo agents in the overcoat material compared to other components within the photoresist matrix is significantly greater than 1 as to allow lower wavelengths to be chosen (e.g., for this situation, an exemplary choice of 266 nm wavelength as a target for material absorption and exposure).

According to an embodiment, the dose of electromagnetic radiation applied to different regions of the wafer is varied. For example, the dose delivered to the wafer can be location specific to create localized concentrations of acid molecules in the overcoat material. The location-specific dose can be controlled by several embodiment methods. In one method embodiment, use of digital pixel-based projection systems is proposed. The system, an array of independently addressable projection points, can project wafer level patterns that spatially characterize critical dimension values of structures. The digital pixel-based projection system can be embodied as a digital light processing (DLP) chip, grating light valve (GLV), or other micro projection technology ("Other"), with a light source that can focus an image or pattern (optionally using a lens) onto a wafer and correct or adjust critical dimension means and non-uniformities. Location-specific dose control can be achieved in this system by light source power and source shaping, projection mirror oscillation rate, and/or mirror "on" state to correct or adjust critical dimension means and non-uniformities.

In another location-specific dose delivery method, a light source (an exemplary example being a 266 nm laser beam) can be directed onto a galvo-controlled mirror system. The galvo-controlled mirror system ("galvo-mirror") can redirect the laser onto any location on the wafer surface allowing for wafer level patterns that spatially characterize critical dimension values of structures. Location-specific dose control can be achieved in this system by laser pulse frequency, laser pulse power, galvo mirror control (scan rates in 2-dimensions), and in some embodiments wafer control (substrate translation) to correct or adjust critical dimension means and non-uniformities.

In another location-specific dose delivery method, dose is delivered via rotating and translating the wafer under a fixed light source. The light source, for example, could be a single controllable source (e.g., a 300+ mm size bulb) or a series of controllable, independent zones (e.g., along the long axis of the light source). Similarly, the wafer could be fixed, and the light could rotate and translate over the wafer. Such a hardware concept allows for many pathways to alter the dose signature delivered within-wafer (WIW) to alter the final WIW CD alteration signature. For this embodiment, as shown in FIG. 2, the radial dose alteration can include variable settings for rotation, scan rate, power setting, light source working distance, use of apertures, focal positions, light source zonal control, to name a few, as well as any permutations thereof. Thus, embodiments for exposing the overcoat layer to electromagnetic radiation can include scanning the wafer, scanning the radiation source (e.g., a laser beam), rotating the wafer, or a combination of two or more thereof.

In another embodiment, exposure by any of the location-specific dose delivery methods described above can be combined to correct or adjust for critical dimension means and non-uniformities. Specific examples of sub-process flows for the location-specific dose delivery method include, but are not limited to:

Sub Flow A: XXXnm DLP or GLV or Other→Flood Bake
Sub Flow B: XXXnm Galvo-mirror→Flood Bake
Sub Flow C: XXXnm Rotation/Translation Flood→Flood Bake
Sub Flow D: XXXnm Galvo-mirror XXXnm Rotation/Translation Flood→Flood Bake where XXX=175~450 nm, for example 266 nm. Any other combination of the Sub Flows A-D may be used.

Referring again to FIGS. 1A-1C, following exposure of the overcoat layer 16 to electromagnetic radiation 20, the overcoat layer 16 and patterned layer 14 are heated or baked to drive acid diffusion from the overcoat material into the radiation-sensitive material matrix (local diffusion processes will depend on local acid concentration in the near region) and ultimately de-protection of the protected polymer by the new acid incorporated into the radiation-sensitive material matrix. Then the overcoat layer 16 and patterned layer 14 are developed, for example using positive tone developer as shown in FIG. 1C, to remove the overcoat layer and reduce the critical dimension of the patterned layer 14 from CD1 to a second critical dimension, CD2. By way of example and not limitation, the developer may be the traditional industry 0.26N TMAH for positive tone develop or n-butyl acetate or cyclohexane, or similar negative tone solvents for negative tone develop.

With further regard to the processing flow using the overcoat material to facilitate CD alteration, in accordance with one embodiment, and as shown in the flow chart 300 of FIG. 3, the process begins at 310 with initial processing of the wafer (e.g., substrate 10 of FIG. 1A). At 320, a thin film is added, which may be referred to as the underlying layer (e.g., underlying layer 12 of FIG. 1A) into which a pattern is to be transferred. At 330, a coating of radiation-sensitive material, for example a photoresist, is applied over the thin film. At 340, a lithography process is performed on the radiation-sensitive material coating. More specifically, the radiation-sensitive material coating is exposed through a mask to a wavelength ($\lambda$) of light, typically in the UV spectrum, to create a patterned exposure. At 350, a first post-exposure bake (PEB #1) is performed. In 360, the pattern-exposed radiation-sensitive material coating is subjected to a first development process ($1^{ST}$ DEV) to form a patterned layer, such as patterned layer 14 of FIG. 1A.

In 380, an overcoat layer containing a photo agent material (or materials), such as overcoat layer 16 of FIG. 1A, is applied over the patterned radiation-sensitive material coating. In 390, a location-specific dose exposure process (or processes) is performed to expose the overcoat layer and first developed radiation-sensitive material coating to a second wavelength ($\lambda$) of light to create localized concentrations of acid molecules in the overcoat layer. In 400, a second post-exposure bake (PEB #2) is performed to drive acid diffusion from the overcoat layer into the radiation-sensitive material coating and ultimately de-protection of the protected polymer by the new acid incorporated into the radiation-sensitive material coating. The location-specific dose exposure process and PEB#2 may include, for example, any of the Sub Flows A-D described above, which include a post-exposure flood bake. Prior to the location-specific dose exposure process (at 390), and after the $1^{ST}$ DEV (at 360), an after-develop inspection (ADI) may optionally be performed, at 370, as part of a feed-forward (FF) control strategy. Specifically, the process parameters of the location-specific dose exposure in 390, such as the dose of electromagnetic radiation applied to different regions of the substrate, can be altered based on a metrology data obtained from inspecting the first-developed radiation-sensitive material coating, as indicated by the FF arrow.

After the location-specific dose exposure and PEB #2 processes, a second development process ($2^{ND}$ DEV) is performed at 410 to remove the overcoat layer and reduce the critical dimension of the patterned radiation-sensitive material coating from a first critical dimension (CD1) to a second critical dimension (CD2). In one embodiment, the overcoating, location-specific dose exposure and PEB #2 at 380 to 410 are performed within the same photolithography track tool in which the patterned layer was formed at 330 to 360. In another embodiment, the overcoating, location-specific dose exposure and PEB #2 at 380 to 410 are performed in a tool separate from the photolithography track tool in which the patterned layer was formed at 330 to 360. At 430, the underlying thin film is etched using the patterned radiation-sensitive material coating with CD2 as a mask. At 450, processing of the wafer continues with a Next Process. A new wafer may then be processed according to the flow chart 300, which may be referred to as a subsequently-processed substrate.

Optionally, flow chart 300 may include ADI at 420 and/or an after-etch inspection (AEI) at 440, in which the wafer is inspected after the $2^{ND}$ DEV at 410 and/or after the etch at 430, respectively, as part of a feed-back (FB) control strategy. Specifically, the process parameters, e.g., dose of electromagnetic radiation applied to different regions of the substrate, of the location-specific dose exposure in 390 can be altered for a subsequently processed substrate based on metrology data obtained from inspecting the second-developed radiation-sensitive material coating and/or the etched underlying thin film layer, as indicated by the FB arrows. Additionally, metrology data from ADI in 370 or 420 can be fed forward to the etch process in 430.

CD uniformity can vary across a surface of a substrate (i.e., wafer). For example, a given wafer can have one CD value in a center portion of the wafer, while having another CD value closer to an edge of a wafer. A wafer can also have CDs that vary based on order of exposure progression, such as when using a stepper exposure system. Depending on the particular area of a given wafer, CDs may be too large or too small, and the CD variation may be spread randomly across the wafer, may be based on radial location, and/or may correlate with particular features such as location of scribe lanes. With the prior art wet processing methods (hot develop and/or acid rinse), this made altering WIW CD alteration amount to account for photolithography cell systematics (errors, issues) and/or external processing systematics (e.g., etch) difficult, because it would require some type of WIW concentration or refresh rate chemical control scheme and/or high spatial resolution (zone) bake, and there was no within-die correction possible. Location-specific dose exposure hardware and control can more easily manipulate WIW CD alteration amount process control due to being able to apply localized differences in exposure dose on the wafer (which leads to localized differences in acid generation (loadings) in the overcoat material, which ultimately facilitates localized differences in CD changes after DEV #2). Depending on the location-specific dose exposure hardware (or hardware combinations thereof), the CD signature/systematic within-exposure shot/die (WIS) can be corrected as well as WIW systematics (for instance, radial systematics, which is a WIW CD systematic that is highly correlated with radius position, or tilt systematics, which is a WIW CD systematic that is highly correlated with a single axis when tilt orientation is known). There are many pathways to feed forward WIS control. Two such correction schemes (but not limited to) include applying an averaged field signature of all dies on the wafer (or series of wafers, or any subset thereof) or by using a die-by-die specific correction strategy. Likewise, there are many pathways to feed forward WIW radial or tilt control. Two such methods for WIW radial control are 1) representing the CD wafer map by the radial terms within a multi-degree (radial/ azimuthal) Zernike polynomial fit, or 2) fitting a high order polynomial to the averaged CD response through radius. Two such methods for WIW tilt control are 1) representing the CD wafer map by the $1^{st}$ degree radial terms within a Zernike polynomial fit, or 2) by finding the optimal angle at which averaging along the axes that is perpendicular to axes of interest, best represents experimental dataset.

With regard to process control schemes, there are several FF or FB control schemes that can be used independently or in conjunction with one another, as discussed above with reference to flow chart 400. Averaged after-etch inspection results can be fed back to facilitate lot-level average power setting and/or WIW power signature adjustments to correct for fluctuations observed with AEI. The source of fluctuations can be inherent to the etch process, lithography process, and other processing steps. Likewise, averaged after-develop inspection (ADI) results can be fed back to facilitate lot-level average power setting and/or WIW power signature adjustments to correct for fluctuations observed with ADI. In the case of CD alteration processes having at least 2 development steps (e.g., 360 and 410), ADI results can be used from either ADI step (e.g., 370 or 420) and be fed back for control of subsequently processed wafers. Specific to doing an ADI step post $1^{ST}$ DEV (e.g., 360), but prior to CD alteration processes (e.g., location-specific dose exposure at 390, bake at 400, $2^{ND}$ DEV at 410), feed forward control strategies at the wafer level are enabled. A known ADI CD map can be fed forward into a flood exposure controller to augment the flood process (dose delivered locally within-wafer) specific to that wafer for tighter final altered CD distribution. Any of the above control schemes used by themselves, or in conjunction, lead to tighter altered CD or patterning CD control.

In sum, the aforementioned offers an alternative way to maximize the CD alteration amount achievable (break from de-protection matrix dictated by primary exposure conditions) and to allow for more standard development conditions. It shifts CD alteration amount control to be largely controlled by flood dose versus development concentration and/or develop time which simplifies the CD alteration development process. It introduces new photo-active chemistries to be used as a primary mechanism for acid generation for CD alteration that will ultimately lead to better de-protection control of features. Finally, it uses location-specific critical dimension (CD) alteration/correction flows and processes for improvement of CD uniformity, and in some embodiments shifting of CD targeting as well, making use, in some embodiments, of after develop inspection (ADI) information in a feed forward (FF) process control scheme by means of localized dose control of a flood process step.

With this modified approach to CD alteration, WIW control schemes can also be more realizable; allowing for tighter CD alteration or patterning CD control.

According to an embodiment, a system is also provided for reducing the critical dimension of a pattern formed on a substrate. The system comprises an overcoat spin-cup for depositing an overcoat layer atop a patterned layer on the substrate, and an exposure system for exposing the overcoat layer to electromagnetic radiation, as discussed in detail above. The system further includes a heating module for heating (baking) the substrate, and a developer spin-cup for applying developer to the overcoat layer and a patterned layer to reduce the critical dimension of the patterned layer. Additionally, the system includes a controller for controlling the overcoat spin cup, the exposure system, the heating module, and the developer spin-cup. The controller is configured to vary the dose of electromagnetic radiation applied to different regions of the overcoat layer on the substrate, as discussed above, based on first metrology data received from a first ADI performed prior to receiving the substrate by the system, or on second metrology data received from a second ADI performed after an alteration of critical dimension within the system, or on third metrology data received from an AEI performed after an etch process using the patterned layer as a pattern, or a combination or two or more thereof.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/ or described operations may be omitted in additional embodiments.

"Substrate" as used herein generically refers to the object being processed in accordance with the invention. The substrate may include any material portion or structure of a device, particularly a semiconductor or other electronics device, and may, for example, be a base substrate structure, such as a semiconductor wafer, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

While the present invention has been illustrated by the description of one or more embodiments thereof, and while the embodiments have been described in considerable detail, they are not intended to restrict or in any way limit the scope of the appended claims to such detail. Additional advantages and modifications will readily appear to those skilled in the art. The invention in its broader aspects is therefore not limited to the specific details, representative apparatus and method and illustrative examples shown and described. Accordingly, departures may be made from such details without departing from the scope of the general inventive concept.

What is claimed is:

1. A method for patterning a substrate, comprising:
   receiving a substrate, the substrate comprising:
      an underlying layer, and
      a patterned layer formed on the underlying layer, the patterned layer comprising radiation-sensitive material and further comprising a pattern of varying elevation and having a first critical dimension at a first region and a second critical dimension at a second region, the second region being different from the first region and the second critical dimension being different from the first critical dimension;
   applying an overcoat layer over the patterned layer, the overcoat layer comprising a photo agent selected from a photosensitizer generator compound, a photosensitizer compound, a photoacid generator compound, a photoactive agent, an acid-containing compound, or a combination of two or more thereof;
   exposing the overcoat layer to electromagnetic radiation, wherein a first dose of the electromagnetic radiation incident upon the first region is different from a second dose of the electromagnetic radiation incident upon the second region, the difference between the first dose and the second dose being based on a critical dimension (CD) difference between the first critical dimension and the second critical dimension;
   heating the overcoat layer and patterned layer; and
   developing the overcoat layer and the patterned layer to reduce the CD difference.

2. The method of claim 1, wherein the step of exposing the overcoat layer comprises exposing the overcoat layer to ultraviolet (UV) radiation.

3. The method of claim 2, wherein a wavelength of ultraviolet (UV) radiation is from 175 nm to 450 nm.

4. The method of claim 1, wherein the step of exposing the overcoat layer comprises scanning the substrate, scanning a radiation source, rotating the substrate, or a combination of two or more thereof.

5. The method of claim 1, wherein the step of exposing the overcoat layer comprises exposing the overcoat layer to a scanning laser beam to produce the first dose and the second dose by variation in at least one of pulse frequency and pulse power between the first dose and the second dose.

6. The method of claim 1, wherein the step of exposing the overcoat layer comprises exposing the overcoat layer to the electromagnetic radiation from a digital light projection (DLP) system to produce the first dose and the second dose by variation in at least one of light source power, source shaping, oscillation rate, and mirror "on" state between the first dose and the second dose.

7. The method of claim 1, further comprising:
   receiving first metrology data from a first after-develop inspection (ADI) performed prior to the step of receiving the substrate.

8. The method of claim 7, wherein the CD difference is based on the received first metrology data.

9. The method of claim 1, further comprising:
   measuring second metrology data in a second after-develop inspection (ADI) performed after the step of developing the overcoat layer and the patterned layer.

10. The method of claim 9, further comprising:
    altering the dose of the electromagnetic radiation incident upon different exposed regions of a subsequently-processed substrate during the step of exposing the overcoat layer based on the second metrology data.

11. The method of claim 1, further comprising:
    etching the underlying layer using the patterned layer having the reduced CD difference as a pattern; and
    measuring third metrology data in an after-etch inspection (AEI) performed after the step of etching the underlying layer.

12. The method of claim 11, further comprising:
    altering the dose of the electromagnetic radiation incident upon different exposed regions of a subsequently-processed substrate during the step of exposing the overcoat layer based on the third metrology data.

13. The method of claim 1, wherein the steps of applying and exposing the overcoat layer, and heating and developing the overcoat layer and the patterned layer are performed within a same photolithography track tool in which the patterned layer was formed.

14. The method of claim 1, wherein the steps of applying and exposing the overcoat layer, and heating and developing the overcoat layer and the patterned layer are performed in a tool separate from a photolithography track tool in which the patterned layer was formed.

15. A method, comprising:
    receiving a substrate, the substrate comprising:
       an underlying layer, and
       a radiation-sensitive material layer deposited on the underlying layer;
    exposing a first wavelength of light through a patterned mask onto the radiation-sensitive material layer and performing a post-exposure bake;
    first developing the pattern-exposed radiation-sensitive material layer to form a patterned layer of varying elevation and having a first critical dimension at a first region and a second critical dimension at a second region, the second region being different from the first region and the second critical dimension being different from the first critical dimension;
    obtaining first metrology data for the patterned layer following the first developing;
    applying an overcoat layer over the patterned layer, the overcoat layer comprising a photo agent selected from a photosensitizer generator compound, a photosensitizer compound, a photoacid generator compound, a photoactive agent, an acid-containing compound, or a combination of two or more thereof;
    exposing the overcoat layer to electromagnetic radiation at a wavelength of 175 nm to 450 nm, wherein a first dose of the electromagnetic radiation incident upon the first region is different from a second dose of the electromagnetic radiation incident upon the second region, the difference between the first dose and the second dose being based on a critical dimension (CD)

difference between the first critical dimension and the second critical dimension from the obtained first metrology data;

performing a post-exposure bake of the overcoat layer and patterned layer; and developing the overcoat layer and the patterned layer to reduce the CD difference.

16. The method of claim 15, wherein the step of exposing the overcoat layer comprises scanning the substrate, scanning a radiation source, rotating the substrate, or a combination of two or more thereof.

17. The method of claim 15, wherein the step of exposing the overcoat layer comprises exposing the overcoat layer to a scanning laser beam to produce the first dose and the second dose by variation in at least one of pulse frequency and pulse power between the first dose and the second dose.

18. The method of claim 15, wherein the step of exposing the overcoat layer comprises exposing the overcoat layer to electromagnetic radiation from a digital light projection (DLP) system to produce the first dose and the second dose by variation in at least one of light source power, source shaping, oscillation rate, and mirror "on" state between the first dose and the second dose.

19. The method of claim 15, further comprising:

etching the underlying layer using the patterned layer having the reduced CD difference second critical dimension as a pattern.

20. The method of claim 19, further comprising:

measuring second metrology data in a second after-develop inspection (ADI) performed after the step of developing the overcoat layer and the patterned layer and/or measuring third metrology data in an after-etch inspection (AEI) performed after the step of etching the underlying layer; and altering the dose of the electromagnetic radiation incident upon different exposed regions of a subsequently-processed substrate during the step of exposing the overcoat layer based on the second metrology data, or the third metrology data, or a combination of the second and third metrology data.

21. A method, comprising:

receiving a substrate, the substrate comprising:
an underlying layer, and
a radiation-sensitive material layer deposited on the underlying layer;

exposing a first wavelength of light through a patterned mask onto the radiation-sensitive material layer and performing a post-exposure bake;

first developing the pattern-exposed radiation-sensitive material layer to form a patterned layer of varying elevation and having a first critical dimension;

obtaining first metrology data for the patterned layer following the first developing;

applying an overcoat layer over the patterned layer, the overcoat layer comprising a photo agent selected from a photosensitizer generator compound, a photosensitizer compound, a photoacid generator compound, a photoactive agent, an acid-containing compound, or a combination of two or more thereof;

exposing the overcoat layer to electromagnetic radiation at a wavelength of 175 nm to 450 nm, wherein a dose of electromagnetic radiation incident upon different exposed regions of the substrate is varied and is based on the obtained first metrology data;

performing a post-exposure bake of the overcoat layer and patterned layer; and developing the overcoat layer and the patterned layer, to alter the first critical dimension of the patterned layer to a second critical dimension;

etching the underlying layer using the patterned layer having the second critical dimension as a pattern;

measuring second metrology data in a second after-develop inspection (ADI) performed after the step of developing the overcoat layer and the patterned layer and/or measuring third metrology data in an after-etch inspection (AEI) performed after the step of etching the underlying layer; and altering the dose of the electromagnetic radiation incident upon different exposed regions of a subsequently-processed substrate during the step of exposing the overcoat layer based on the second metrology data, or the third metrology data, or a combination of the second and third metrology data.

* * * * *